United States Patent
Francis et al.

(10) Patent No.: US 9,129,045 B2
(45) Date of Patent: Sep. 8, 2015

(54) INTERACTIVE MAGNIFICATION TOOL

(75) Inventors: Kevin R. Francis, Liverpool, NY (US); Michael C. Lesmerises, Liverpool, NY (US); Justin R. Louise, Jamesville, NY (US); Clayton E. Stetz, Syracuse, NY (US)

(73) Assignee: C SPEED, LLC, Liverpool, NY (US)

( * ) Notice: Subject to any disclaimer, the term of this patent is extended or adjusted under 35 U.S.C. 154(b) by 648 days.

(21) Appl. No.: 12/766,582

(22) Filed: Apr. 23, 2010

(65) Prior Publication Data

US 2011/0261078 A1 Oct. 27, 2011

(51) Int. Cl.
*G09G 5/00* (2006.01)
*G06F 11/32* (2006.01)
*G06F 3/0485* (2013.01)
*G01R 13/02* (2006.01)

(52) U.S. Cl.
CPC ............ *G06F 11/322* (2013.01); *G06F 3/0485* (2013.01); *G01R 13/0236* (2013.01); *G06F 2203/04806* (2013.01); *G09G 2340/045* (2013.01)

(58) Field of Classification Search
None
See application file for complete search history.

(56) References Cited

U.S. PATENT DOCUMENTS

| | | | |
|---|---|---|---|
| 4,972,138 A | 11/1990 | Bush | |
| 6,463,392 B1 | 10/2002 | Nygaard et al. | |
| 6,466,006 B2 | 10/2002 | Alexander | |
| 6,615,369 B1 | 9/2003 | Beck et al. | |
| 7,443,396 B2 * | 10/2008 | Ilic | 345/440.1 |
| 2001/0001137 A1 | 5/2001 | Alexander | |
| 2004/0017399 A1 * | 1/2004 | Beck et al. | 345/805 |
| 2005/0068339 A1 * | 3/2005 | Lipsky et al. | 345/661 |
| 2007/0088529 A1 | 4/2007 | Nygaard, Jr. | |
| 2010/0083165 A1 * | 4/2010 | Andrews et al. | 715/784 |
| 2010/0188406 A1 * | 7/2010 | Kincaid | 345/440 |

OTHER PUBLICATIONS

Mirkovic et al. "Optical signals in colored Gaussian Noise" Series: Electronics and Energetics vol. 10 No. 2, 1997 p. 237-244.*
TracerDAQ User Manual, version 12, Nov. 2008, downloaded @http://www.microdaq.com/measurement_computing/documents/tracerdaq-usermanual.pdf.*
Simvision User Guide, by Cadence Product Version 9.2, Nov. 2008, due to the space limitation only Chapter 17 and 19 attached. The whole User Guide can be downloaded @http://www.ece.cmu.edu/~ece447/s13/lib/exe/fetch.php?media=simvision.pdf.*

* cited by examiner

*Primary Examiner* — Yingchun He
(74) *Attorney, Agent, or Firm* — Kenneth J. Lukacher Law Group; R. S. Rosenholm

(57) ABSTRACT

A method and apparatus for an alternative representation of information that is displayable onto a user interface display screen. The information can be displayed as at least one portion of a data range, such as data representing characteristics of one or more signals over time, while the alternative representation can be displayed in accordance with a set of one or more user selectable magnification attributes associated with the portions of the data range and associated with one or more axis directions relative to a plane of the display screen.

18 Claims, 13 Drawing Sheets

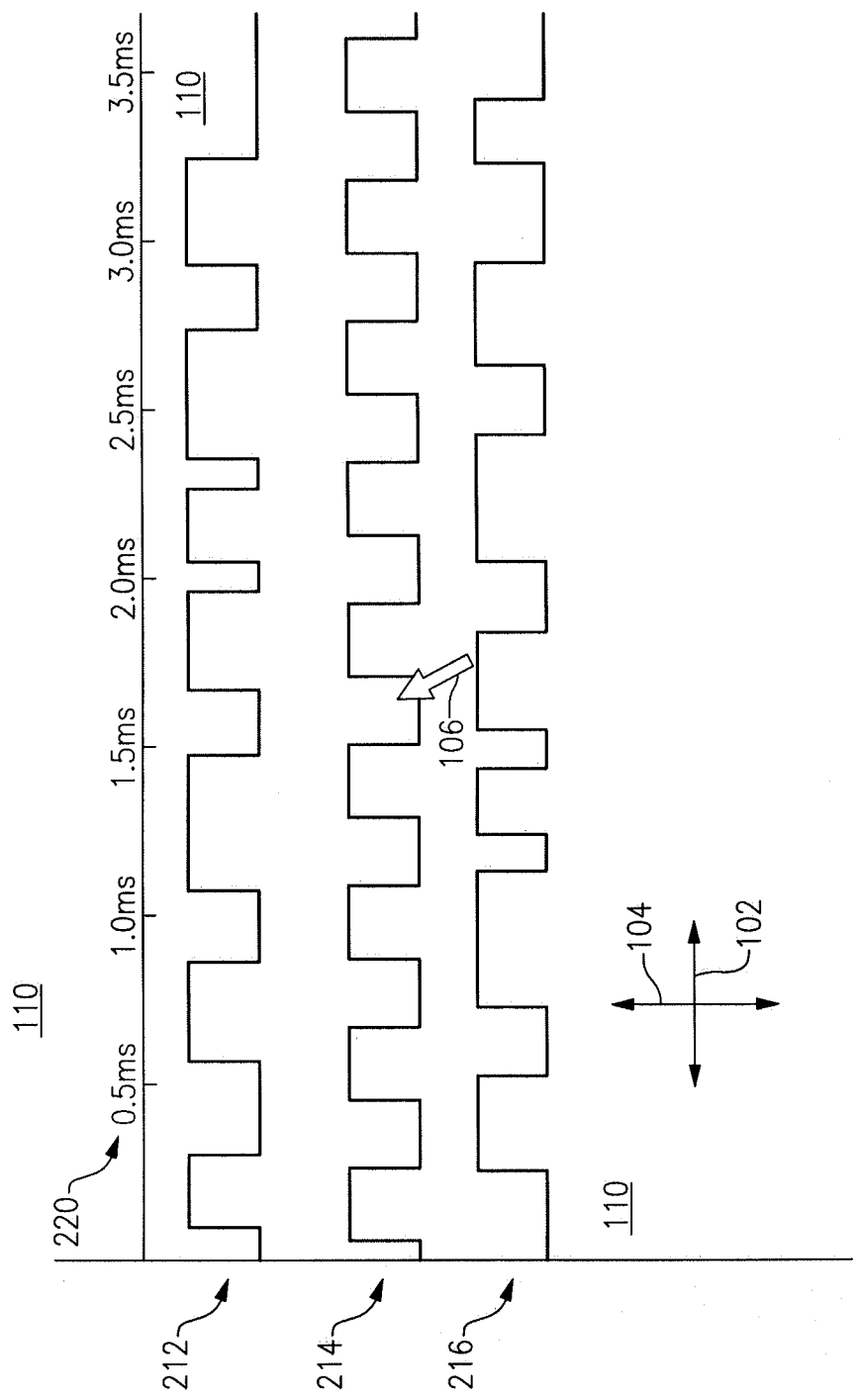

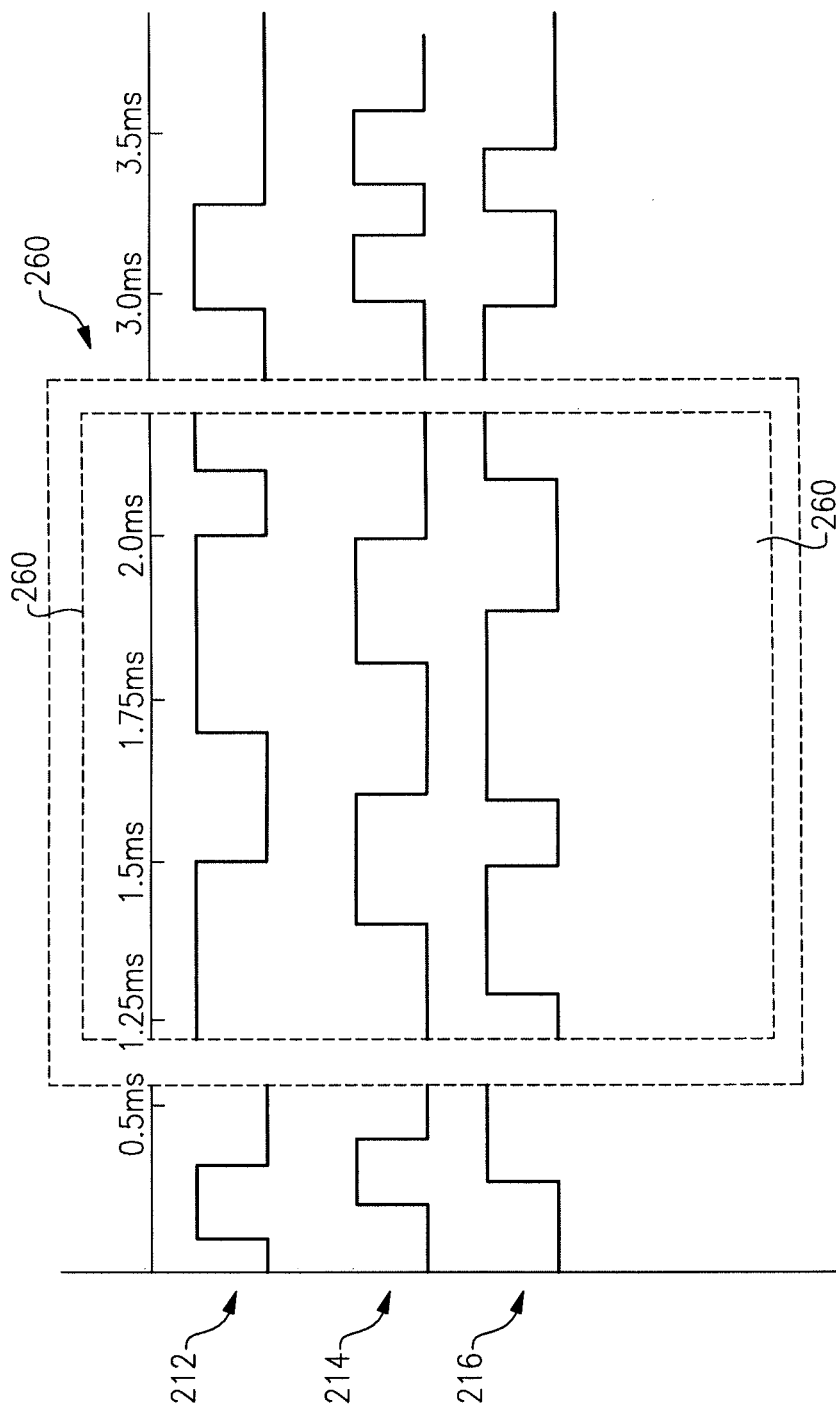

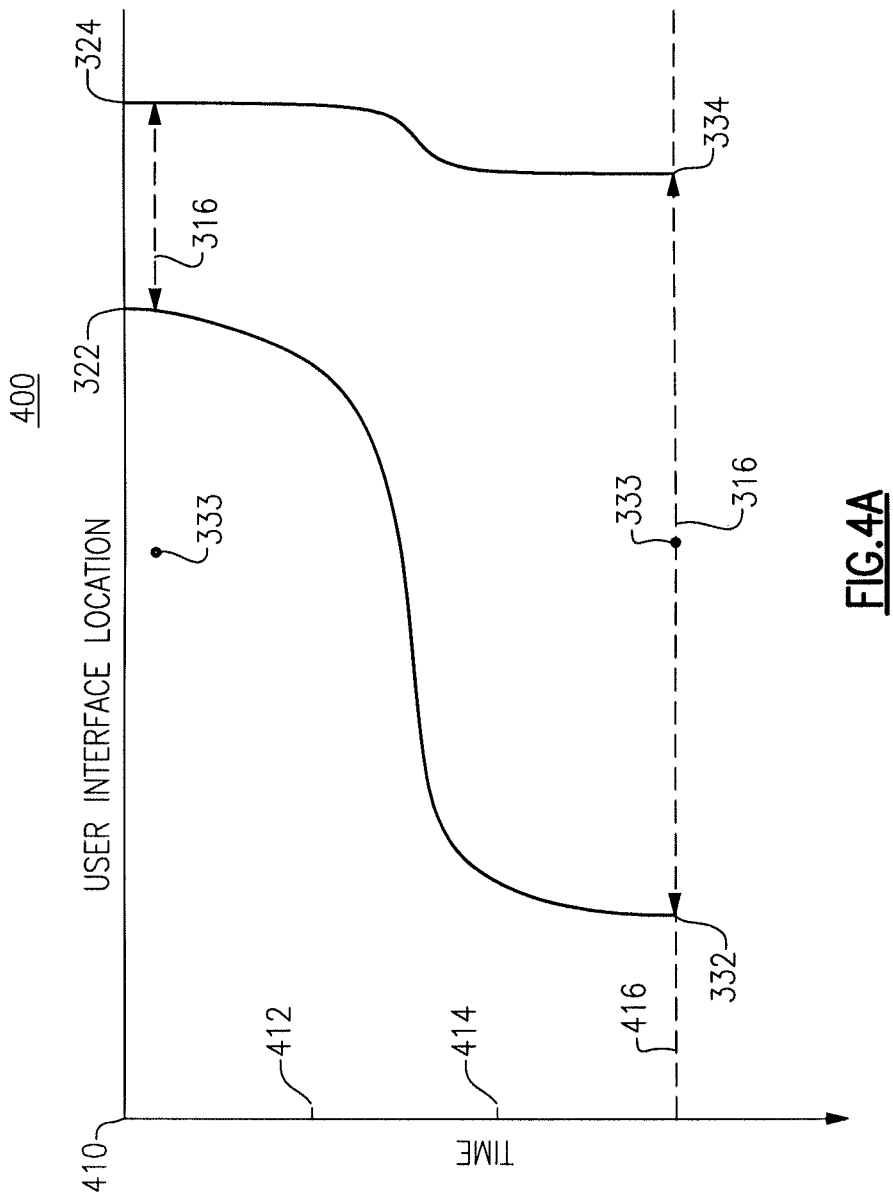

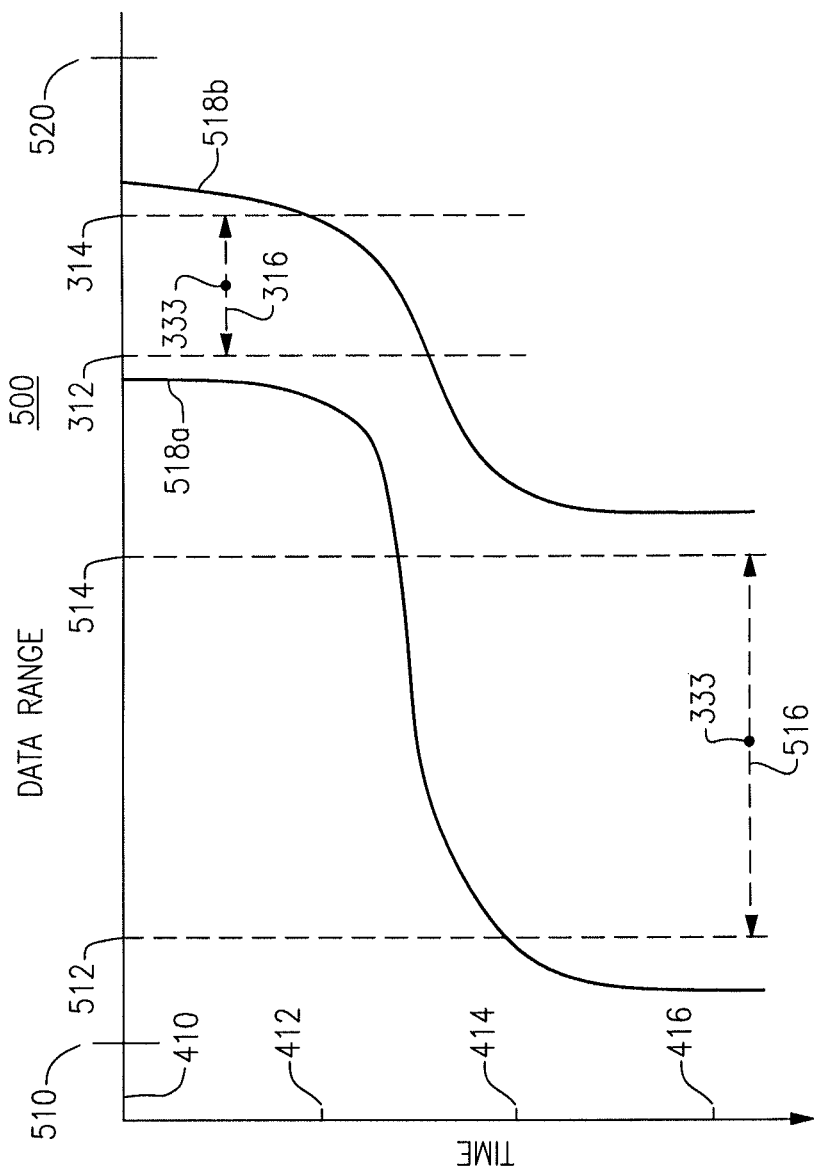

INTERACTIVE MAGNIFICATION TOOL

FIELD OF THE INVENTION

This invention relates to a method and apparatus for an alternative representation of information that is displayable onto a user interface display screen. The information can be displayed as at least one portion of a data range, such as data representing characteristics of one or more signals over time, while the alternative representation can be displayed in accordance with a set of one or more user selectable magnification attributes associated with the portions of the data range and associated with one or more axis directions relative to a plane of the display screen.

BACKGROUND OF THE INVENTION

A logic analyzer is typically employed to monitor and visually represent characteristics of one or more signals in a digital manner over time. An oscilloscope is typically employed to monitor and visually represent characteristics of at least one signal in an analog manner over time. Visual representation of signal characteristics is typically communicated via an electronic display screen.

SUMMARY OF THE INVENTION

This invention relates to a method and apparatus for an alternative representation of information that is displayable onto a user interface display screen. The information can be displayed as at least one selected portion of a data range, such as data representing characteristics of one or more signals over time, while the alternative representation can be displayed in accordance with a set of one or more user selectable magnification attributes and with respect to one or more axis directions relative to a two dimensional plane defined by the display screen.

In accordance with one embodiment of the invention, a magnification window superimposes above a user interface display screen and dynamically repositions in real time as a function of a position of a screen pointing device. Optionally, the magnification window is magnified with respect to only one axis, such as for example, that axis that is parallel to a representation of a period of time. In an alternative embodiment, the magnification window is instead created and positioned in a static location.

In another embodiment of the invention, at least one redisplay area occupying a portion of the user interface screen is configured to re-display a portion of data in accordance with a set of magnification attributes. Optionally, in some embodiments, each of two different portions of data are displayed into separate redisplay areas that occupy separate portions of the user interface screen. In some embodiments, a re-display area of the data can occupy a substantially different location as well as a substantially larger portion of the user interface screen as compared to a prior display of the same portion of data outside of a re-display area.

BRIEF DESCRIPTION OF THE DRAWINGS

The objects and features of the invention can be better understood with reference to the claims and drawings described below. The drawings are not necessarily to scale, and the emphasis is instead generally being placed upon illustrating the principles of the invention. Within the drawings, like reference numbers are used to indicate like parts throughout the various views. Differences between like parts may cause those like parts to be each indicated by different reference numbers. Unlike parts are indicated by different reference numbers.

FIGS. 2A-2E illustrate a signal representation portion of the user interface of FIG. 1, that is enhanced by a dynamically positioning magnification window.

FIGS. 4A-4B illustrate a graphical representation of a transition of between the rendering of the first image 300 of FIG. 3A and a rendering of the second image 330 of FIG. 3B, onto the user interface 100.

FIGS. 5A-5C illustrate a graphical representation of a transition between the rendering of the third image representation and a rendering of the fourth image representation, with respect to locations within a large range of data.

DETAILED DESCRIPTION OF THE INVENTION

Figure 1:
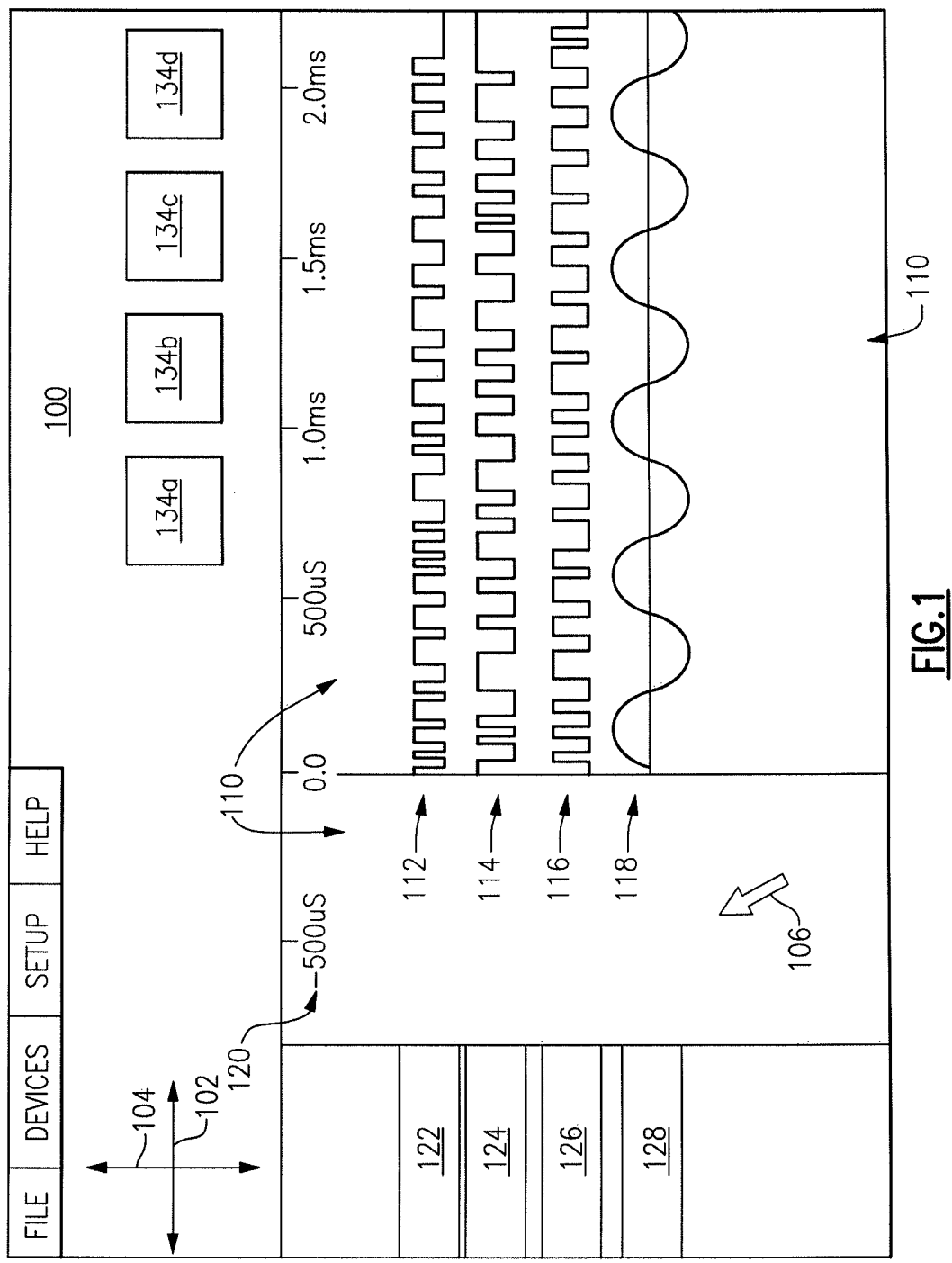
FIG. 1 illustrates a simplified representation of a user interface for a combination Logic Analyzer/Oscilloscope device.

FIG. 1 illustrates a simplified representation of a user interface 100 for a combination Logic Analyzer/Oscilloscope device. A logic analyzer is typically employed to monitor and visually represent characteristics of one or more signals in a digital manner over time. An oscilloscope is typically employed to monitor and visually represent characteristics of at least one signal in an analog manner over time.

In the embodiment shown, the user interface is implemented in combination with a personal computer (PC) executing a Microsoft Windows based operating system. A set of signal acquisition electronics (not shown) is connected to and interoperates with the electronics of the personal computer. Signal monitoring application software, which provides the user interface 100 shown, is also installed onto the personal computer.

The user interface 100 is displayed onto a display screen of the personal computer. The display screen provides a substantially two dimensional area defining a plane having a horizontal axis 102 and a vertical axis 104 as seen by a viewer of the user interface 100. The user interface 100 includes a signal monitoring area 110. The signal monitoring area 110 displays a representation of at least one characteristic of at least one signal over time. A characteristic of a signal, such as a value of its voltage, is represented in a vertical direction that is parallel to the vertical axis 104. A time of occurrence associated with the characteristic of the signal, is represented in a horizontal direction that is parallel to the horizontal axis 102.

As shown, the signal monitoring area 110 includes information representing (3) digital signals 112-116 and (1) analog signal 118. A range of time 120 is indicated at the highest elevated portion of the signal monitoring area 110. The range of time 120 spans horizontally and includes a point in time having a value of 0.0 and spans in both positive and negative time.

A voltage characteristic of a first digital signal 112 over the range of time is displayed at a next highest elevated portion of the signal monitoring area 100, just below the range of time. A voltage characteristic of a second digital signal 114 over time is displayed just below that of the first signal 112. A voltage characteristic of a third digital signal 116 over time is displayed just below that of the second signal 116. A voltage characteristic of a fourth analog signal 118 over time is displayed just below that of the second signal 116.

To a left hand side of the (4) signals 112-118, are (4) signal labels 122-128. Each signal label 122-128 is configured to provide information, such as identification and/or status, in association with a respective signal 112-118. As shown, the signal label 122 provides information associated with signal 112, the signal label 124 provides information associated with signal 114, the signal label 126 provides information associated with signal 116 and the signal label 128 provides information associated with signal 118.

A screen pointer 106, also referred to herein as a mouse pointer 106, is superimposed onto the user interface 100. The position of the screen pointer 106 is determined as a function of a position of a screen pointing device, otherwise referred to herein as a mouse (not shown). Screen pointer activatable push buttons 134a-134d are available to perform various user directed actions towards the user interface 100 for the combination Logic Analyzer/Oscilloscope device.

FIG. 2A illustrates a portion of the signal monitoring area 110 including characteristics of (3) digital signals 212-216, like the (3) digital signals 112-116 shown in FIG. 1. A range of time 220 is indicated at the highest elevated portion of the signal monitoring area 110. The range of time 220 spans parallel to the horizontal axis 102 (horizontally) and includes a point in time having a value of 0.5 milliseconds and spans through a point in time having a value of 3.5 milliseconds.

A voltage characteristic of a first digital signal 212 over the range of time is displayed at a next highest elevated portion of the signal monitoring area 110, just below the range of time 220. A voltage characteristic of a second digital signal 214 over time is displayed just below that of the first signal 212. A voltage characteristic of a third digital signal 216 over time is displayed just below that of the second signal 212. For digital signals the actual voltage of the signal has been compared by the Logic Analyzer device against a threshold to evaluate it as either a 1 or 0; where 1 is represented at the highest vertical location for the given signal and 0 is represented at the lowest vertical location for the given signal. A screen pointer 102 is positioned at a horizontal location of about 1.7 milliseconds in time and positioned at a vertical location at a lowest portion (representing a 0 value) of the representation of the signal 214.

Figure 2B:
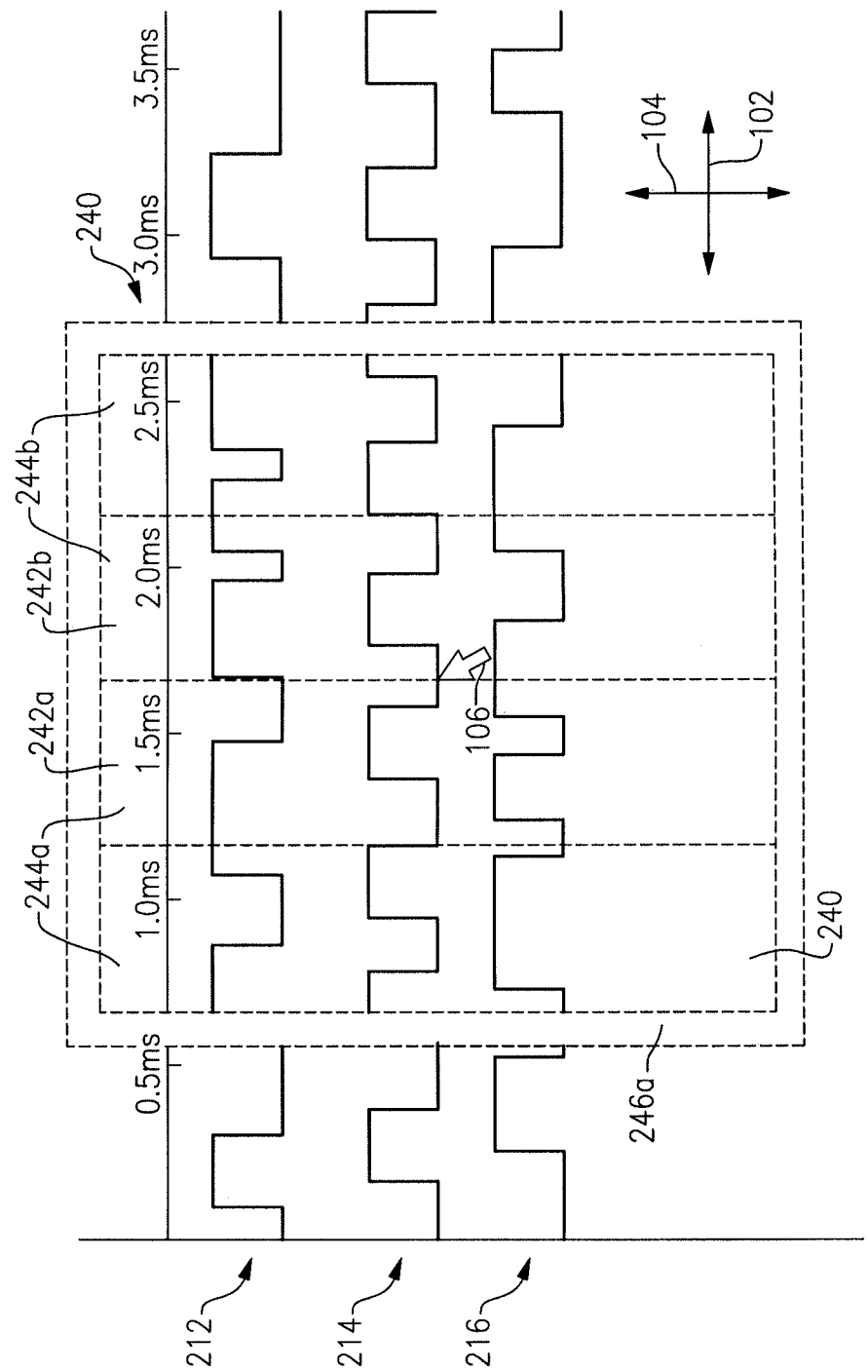

FIG. 2B illustrates an outline of a magnification window grid 240 which dynamically repositions in real time as a function of a position of the screen pointer 112. The magnification window grid 240, also referred to herein as a grid 240, identifies an area surrounding the screen pointing device within which a magnification window (See FIG. 2C) will be constructed upon command. The magnification window is constructed upon execution of a command that is communicated from a user of the user interface 100 to the user interface 100 itself. In some embodiments, the magnification window construction command is executed via activation of a user interface push button, such as for example, one of push buttons 134a-134d. In other embodiments, the command is executed as a selection from a drop down menu. The drop down menu can be constructed from activation of a push button 134a-134d residing within the user interface or activated from pressing of a screen pointing device (mouse) menu button, such as a right mouse button configured for a right handed user, or left mouse button configured for a left handed user.

In some embodiments, the grid 240 is almost entirely transparent, except for the thin (dashed) lines as shown in FIG. 2B. The grid 240 maintains its appearance as it synchronously repositions itself as a function of the position of the screen pointer 106 in real time. For example, when the screen pointer 106 is moved 100 pixels in the left hand direction, the grid 240 moves 100 pixels in the left hand direction synchronously with the screen pointer 106. Accordingly, when the screen pointer 106 moves in an up, down, right or left direction, the grid 240 moves respectively in the up, down, right or left direction for the same distance as the screen pointer 106 in a synchronous and real time manner.

In other embodiments, the grid 240 is entirely transparent (not visible), as it synchronously repositions as a function of the position of the screen pointer 106. As shown, the grid is of a rectangular shape and the screen pointer 106 is located substantially at a center location within the grid 240. In other embodiments, the screen pointer 106 can be located at a non-center location within the grid 240 and/or the grid 240 is not of a rectangular shape.

As shown in this embodiment, the grid 240 delimits a set of areas surrounding the screen pointer 106. A magnify from area 242 is divided into a left hand portion 242a and a right hand portion 242b. A magnify to area 244 is divided into a left hand portion 244a and a right hand portion 244b. The magnify to area 244a-244b is a superset of and includes the magnify from area 242a-242b.

A left hand margin 246a, a right hand margin 246b, a top margin 246c and a bottom margin 246d are each designed to display no underlying signal information while the magnification window (See FIG. 2C) is constructed. In other embodiments, the margin 246a-246d is instead implemented as a wide and opaque line. Each margin 246a-246d functions to visually delimit an inner portion of the grid 240, specifically the magnify to area 244a-244b from a portion of the signal monitoring area 110 that surrounds the grid 240 and the magnification window while it is constructed.

Upon construction of the magnification window (See FIG. 2C), a portion of the user interface image that resides within magnify from area 242 is magnified (expanded) and redisplayed into the magnify to area 244, which occludes and is superimposed above the underlying signal monitoring area 110, while the magnification window synchronously repositions as a function of the position of the screen pointer 106 in real time.

FIG. 2C illustrates construction of a magnification window 260 which dynamically and synchronously repositions in real time as a function of a position of the screen pointer 102. As shown, a portion of the signal monitoring area 110 that resides within the magnify from area 242a-242b is magnified (expanded) with respect to the horizontal axis 102 only, and redisplayed within the magnify to area 244a-244b.

As shown, the magnification operation is performed in a direction parallel to the horizontal axis 102, but not performed in a direction parallel to the vertical axis 104. Any portion of the signal monitoring area 110 that resides within the magnify to area 244a-244b, but not within the magnify from area 242a-242b, is occluded (not displayed) by the magnification window 260 while it is constructed.

Also, the portions of the signal monitoring area 110 that are superimposed by the margins 246a-246d of the magnification window 260 are occluded (not displayed) by the magnification window 260 while it is constructed. Portions of the signal monitoring area 110 that reside outside of the magnification window 260, whether outside of the left or right hand side, or above the top or below the bottom of the magnification window 260 are unaffected by the magnification window 260.

As a result of the magnification window 260 magnifying signal information in a horizontal direction parallel to the direction representing time, and not simultaneously magnifying signal information in a vertical direction, the alignment/continuity of each displayed signal is maintained between the magnification window 260 and the signal monitoring area 110 surrounding the left and right hand side of the magnification window 260, in order to minimize dies-orientation of the user and provide for easier signal analysis.

In this embodiment of the magnification window 260, the magnify to area 244a-244b has a horizontal dimension that is twice the size of the horizontal dimension of the magnify from area 242a-242b. The vertical dimension of the magnify to area 244a-244b is equal to the vertical dimension of the magnify from area 242a-242b. Hence, the horizontal dimension of the magnification window is assigned magnification attribute value equal to 2.0 (magnified to twice its original size) and the vertical dimension of the magnification window is assigned a magnification attribute value equal to 1.0 (not magnified).

Alternatively and hypothetically, to otherwise simultaneously magnify signal information in the vertical direction would break alignment/continuity of each displayed signal between the magnification window 260 and the signal monitoring area 110 surrounding the left and right hand side of the magnification window 260, could cause substantial dis-orientation of the user.

Further notice that except for the margins 246a-246d, other lines of the grid 240 are not visible in order to provide an un-obstructed view of the inside portion of the magnification window 260 inside of its margins 246a-246d. Also notice that the time intervals within the magnification window are indicated with 0.25 millisecond granularity, as opposed to being indicated with 0.5 millisecond granularity.

Figure 2D:
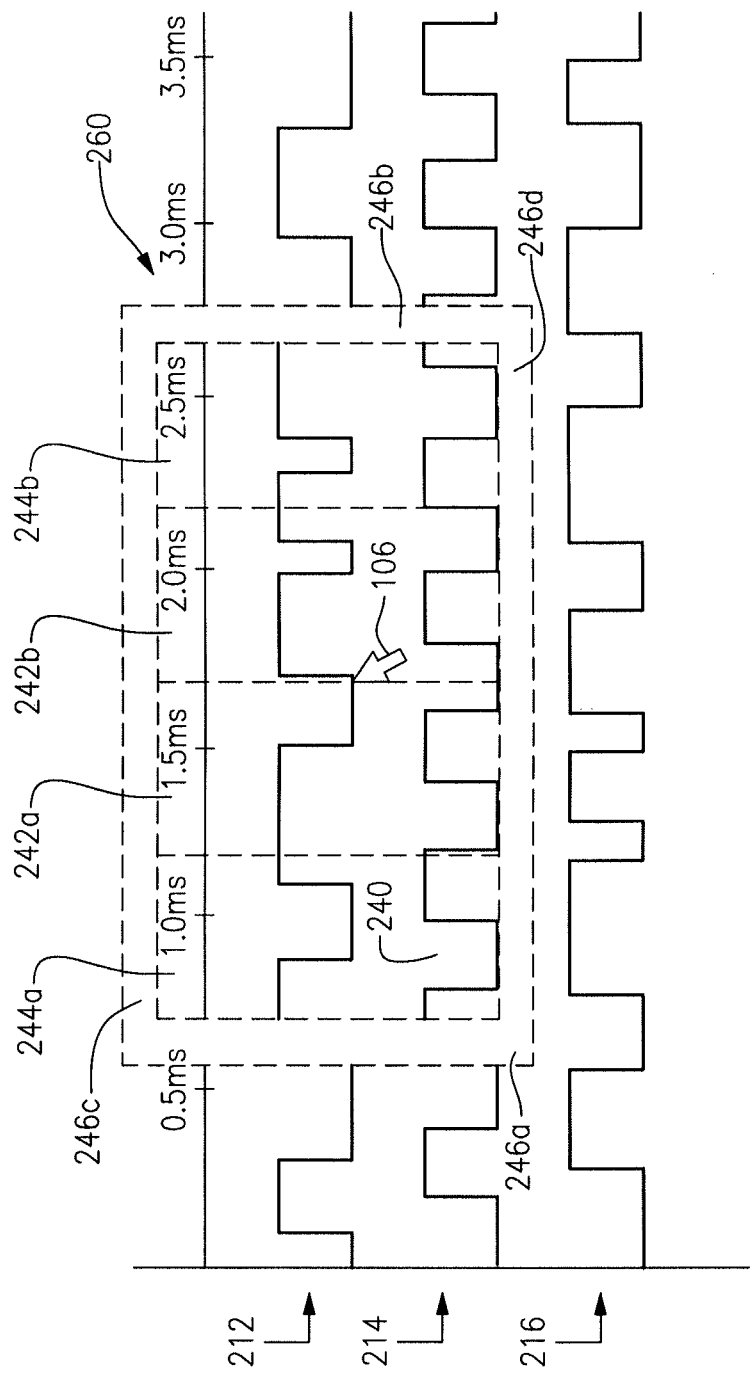
Figure 2E:
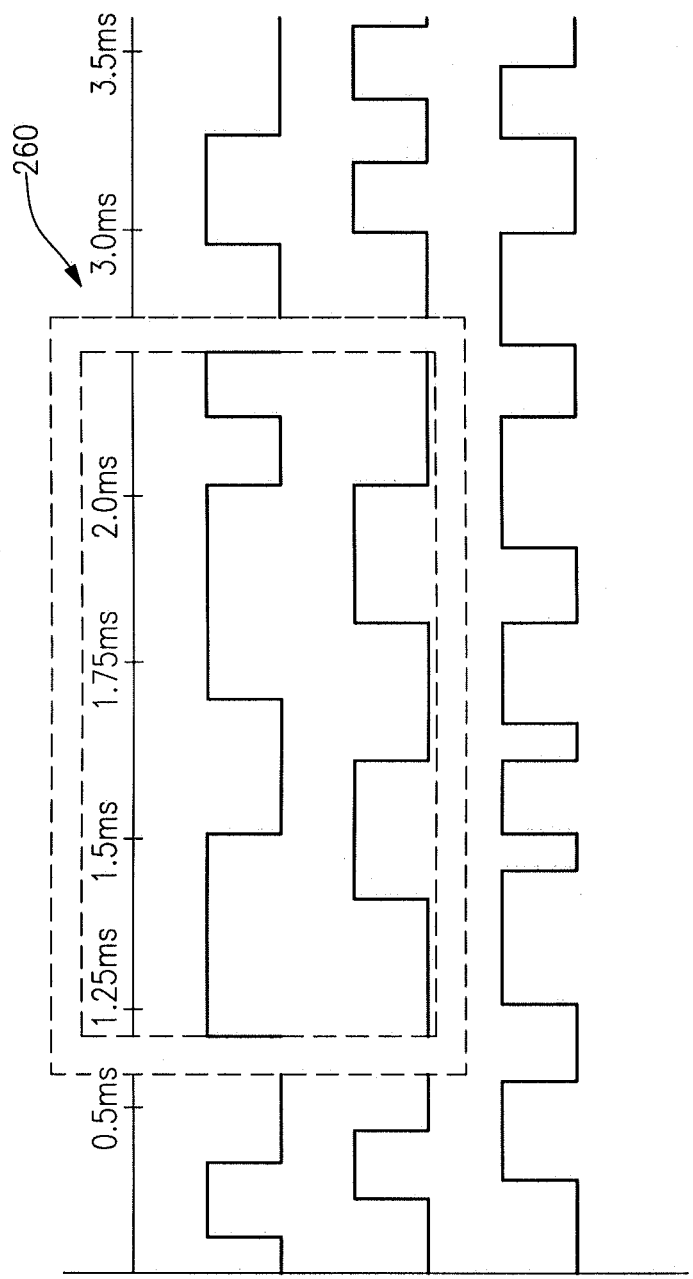

FIGS. 2D-2E illustrate construction of a smaller embodiment of the grid 240 and of the magnification window 260. As shown, the size of the grid 240 and the later constructed magnification window 260 is configurable with respect to its width and height dimension. As shown, a screen pointer 106 is positioned at a horizontal location of about 1.7 milliseconds in time and positioned at a vertical location at a lowest portion (about 0) of the representation of the signal 212.

In this embodiment, the grid 240 is of a rectangular shape and the screen pointer 106 is located substantially at a center location within the grid 240, like that shown in FIG. 2B. Unlike that shown in FIG. 2B, some portion of signal information resides outside and below the grid 240.

FIG. 2E illustrates construction of the smaller embodiment of the magnification window 260 of FIG. 2D. As shown, a portion of the signal monitoring area 110 that resides within the magnify from area 242a-242b is magnified (expanded) with respect to the horizontal axis 102 only, and redisplayed within the magnify to area 244a-244b.

Like FIG. 2C, portions of the signal monitoring area 110 that reside outside of the magnification window 260 are unaffected by the magnification window 260. Unlike that shown in FIG. 2C, unaffected signal information resides below the magnification window 250. In other circumstances, unaffected signal information resides above and/or below the magnification window 260.

In some embodiments of the invention, a horizontal dimension of the magnify from 242a-242b and/or magnify to 244a-244b areas, of the grid 240 and of the magnification window 260, are adjustable by operating a thumb wheel attached to the screen pointing device (not shown). In this manner, a magnification attribute value applied to the magnify from area 242a-242b and the size of the magnification from area 242a-242b are adjustable in real time. The combination of the magnification from area attribute value and the size of the magnify from area 242a-242b, determine the resulting size of the magnify to area 244a-244b. and thus affect the magnification factor as viewed by the user.

In another embodiment, a magnification attribute value applied to the magnify to area 244a-244b and the size of the magnification to area 244a-244b are adjustable in real time. The combination of the magnification to area attribute value and the size of the magnify to area 244a-244b, implicitly determine the corresponding size of the magnify from area 242a-242b, and thus affect the magnification factor as viewed by the user.

Figure 3A:
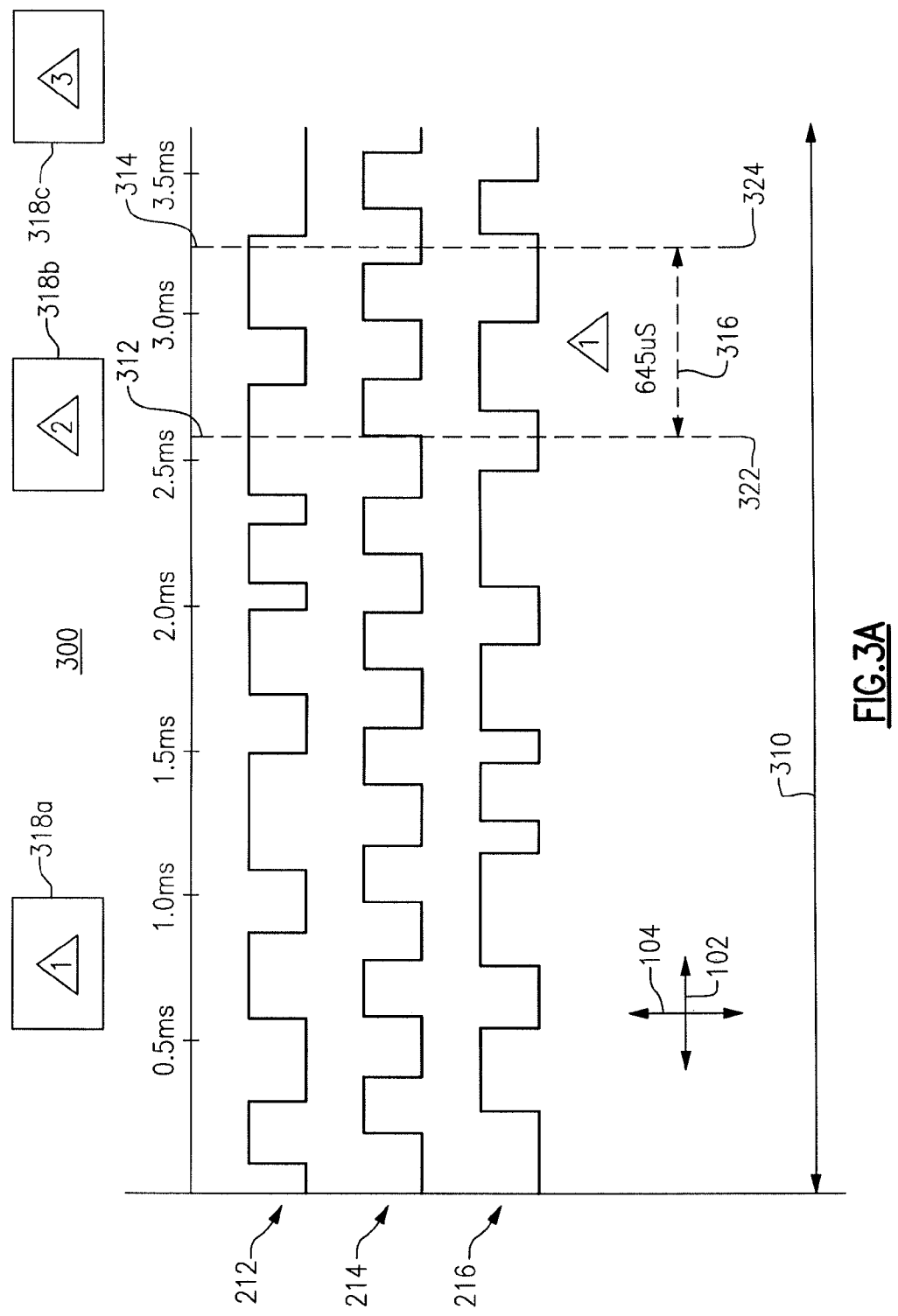
FIGS. 3A-3B illustrates a signal representation portion of the user interface of FIG. 1, that is superimposed by a data focus and redisplay area.
Figure 3B:
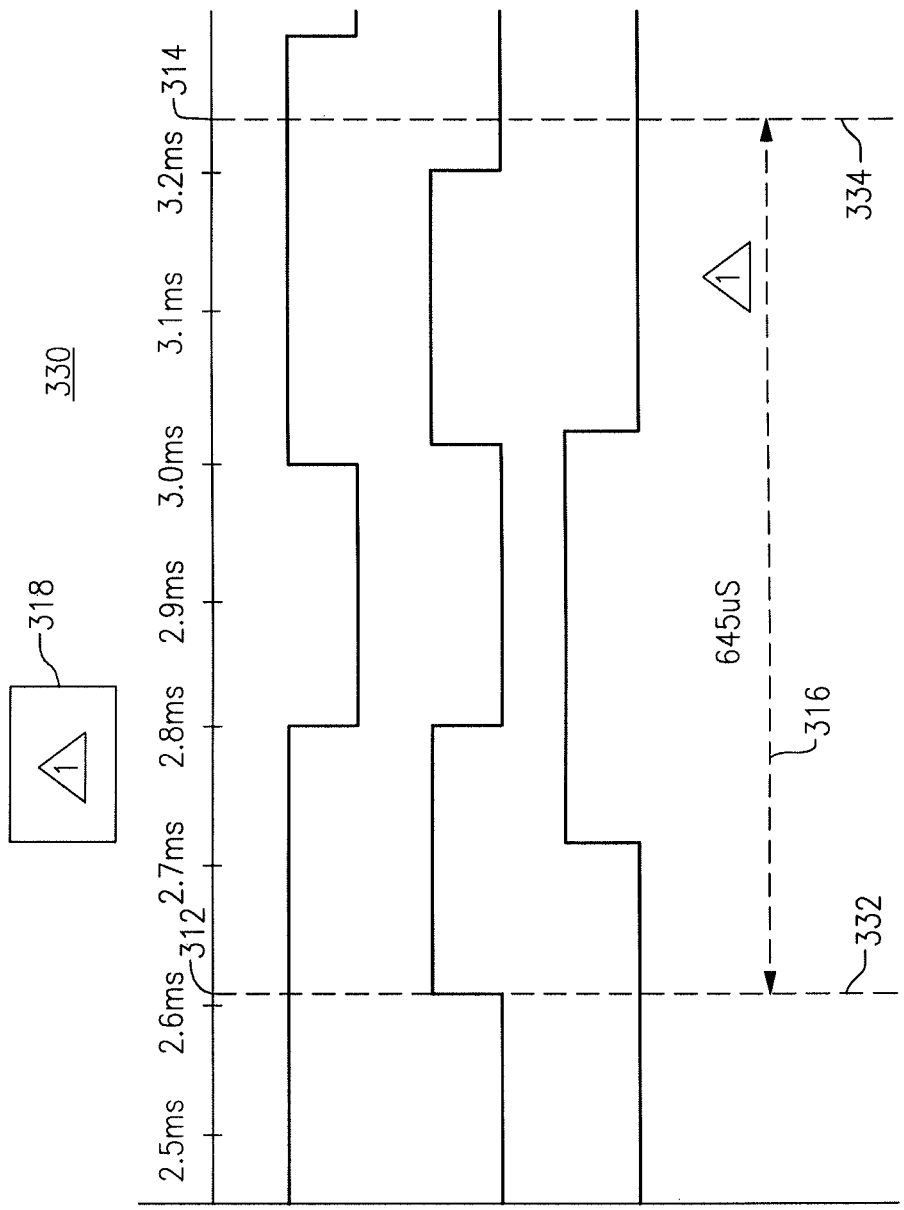

FIGS. 3A-3B illustrate a first image representation 300 and a second image representation 330 of a first portion 316 of a data range 310. The data range 310 of the signal monitoring area 110 (See FIG. 3A) is superimposed by a data isolation and redisplay area (See FIG. 3B). As shown in FIG. 3A, the signal monitoring area 110 includes and displays a first range of data 310 for (3) digital signals. The range of data 310 spans between a point in time at 0.0 milliseconds and a point in time at 3.5 milliseconds.

The range of data 310 shown is a subset of a larger range of data that may not be practical to entirely show within the signal monitoring area 100 at one time. For example, the larger range of data can span a period of time that is substantially and many times larger than 3.5 second interval of time shown. The user interface 100 can be directed to scroll forward or backward in time through the larger range of data (not shown).

A first image representation of a first portion 316 of the range of data 310 shown, is delimited by a first reference marker line 312 and a second reference marker line 314. The first and second reference marker lines 312-314, also referred to herein as reference markers 312-314, mark a range of data with respect to time. The reference markers 312-314 delimit the first portion 316 within a period of time that is 645 microseconds (0.645 milliseconds) in length.

The first portion of data 316 is identified by an index of value "1". The first portion of data 316 spans a horizontal dimension (time) and vertical dimension (characteristics of (3) digital signals over time). The first reference marker 312 has a first horizontal screen location 322 and the second reference marker 314 has a first horizontal screen location 324. The first horizontal screen locations 322-324 mark locations on the user interface screen. As shown, both horizontal screen locations are located to a right hand side of a center location of the user interface screen.

A push button 318a is marked with the index value "1" and functions in association with the first portion of data 316. When the screen pointer 106 passes over the push button 318a, the associated reference marker lines 312, 314 highlight. Upon activating (pressing) the push button 318a of FIG. 3A, the first portion of data 316 is re-displayed as shown in FIG. 3B. When activated (pressed), the push button 318a causes the first image representation 300 (Shown in FIG. 3A) of the first portion of data 316 to be substituted with a second image representation 330 of the first portion of data (Shown in FIG. 3B). Other push buttons 318b-318c are each associated with other reference marker lines (not shown).

As shown in FIG. 3B, the first portion 316 of data is expanded (in this case magnified and shifted left) with respect to its horizontal dimension and un-expanded with respect to its vertical dimension. The horizontal dimension is directed parallel to the horizontal axis 102 and the vertical dimension is directed parallel to the vertical axis 104.

As shown, the size of the second image representation of the first portion of data 316 is expanded by a factor of about 4.5. When the push button 318a of FIG. 3B is again activated (pressed) via exercise of a screen pointing device, for example, the first portion 316 of data is contracted (reverse magnified) with respect to its horizontal dimension and is re-displayed in FIG. 3A.

In this embodiment, the second image representation 330 of FIG. 3B of the first portion of data 316 occupies substantially the entire user interface 100. The first reference marker 312 has a second horizontal screen location 332 and the second reference marker 314 has a second horizontal screen location 334. The first horizontal screen locations 322-324 mark a location on the user interface 100. As opposed to FIG. 3A, the reference marker 312 and its horizontal screen location 322 are located to the left hand side of a center location of the user interface 100, and the reference marker 314 and its horizontal screen location 334 are located to the right hand side of the center location of the user interface 100.

In other embodiments, the second image representation 330 image can occupy a smaller portion of the user interface and/or share the user interface with another second image representation of another portion of data (not shown).

Figure 4B:
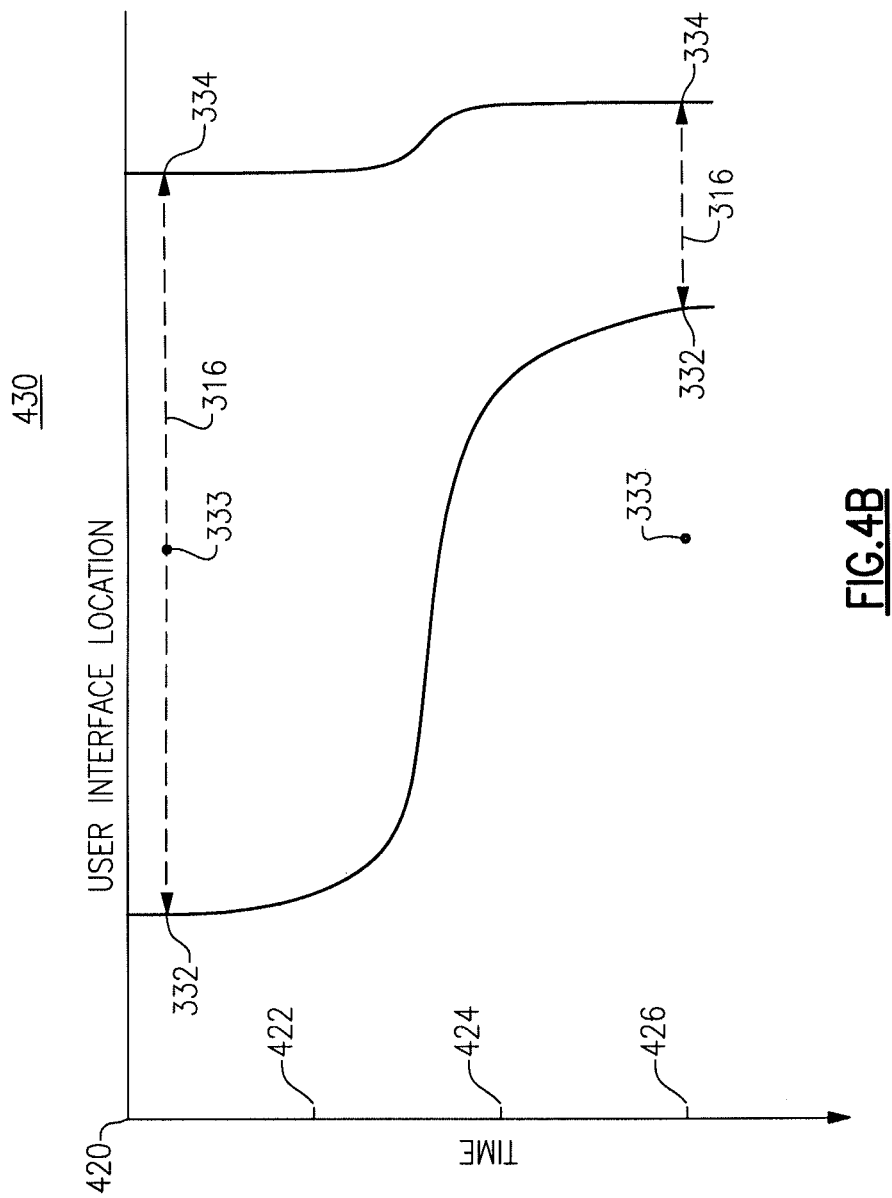

FIGS. 4A-4B illustrate a graphical representation of a transition between the rendering of the first image 300 of FIG. 3A and a rendering of the second image 330 of FIG. 3B, with respect to locations within the user interface 100.

Referring to FIG. 4A, at time 410, the first image representation 300 of the reference markers 312-314 for the first portion of data 316 range between horizontal screen locations 322 and 324. At time 416, the second image representation 330 of the reference markers 312-314 for the first portion of data 316 ranges between horizontal screen locations 332 and 334. A horizontal center location 333 on the user interface 100 is shown.

To reduce and limit disorientation of the user, each reference marker line 312-314, shifts its horizontal location within the user interface 100 as a series of movements over time that are visible to the user. These visible movements of each reference marker occur at a predetermined and non-linear rate while transitioning between each respective first horizontal screen location to each respective second horizontal screen location.

As shown, the time 410 is the start of the transition between display of the first image representation 300 and display of the second image representation 330. The time 412 constitutes about one third of the transition in time and little movement of each of the reference markers 312-314 has occurred. The time 414 constitutes about two thirds of the transition in time and substantial movement of each of the reference markers 312-314 has occurred since the time 412. The time 416 constitutes about the entire the transition in time and insubstantial movement of each of the reference markers 312-314 has occurred since the time 414.

The above described visual transition provides a initiates movement at a substantially slow rate of movement for a first portion of the transition, substantially increases its rate of movement to a substantially higher rate of movement during a second portion of the transition, and terminates movement at a substantially slow rate of movement during a third portion of the transaction. The substantially slow rate of movement is intended to be substantially slower than an average rate of movement as determined over the elapsed time of the transition. The substantially higher rate of movement is intended to be substantially higher than the average rate of movement as determined over the elapsed time of the transition In one embodiment, each reference marker 312-314 independently moves between its initial and final location in accordance with the formula $$d(t)=[-\cos(t*pi/T)+1]*(D/2)$$

where (d) is the horizontal distance between a current location of a reference marker line 312-314 during the transition and its initial location at the start of the transition, (t) is time elapsed between a current time during the transition and the initial time at the start of the transition, (T) is the total time required to perform the transition, (pi) equals about 3.14159, (D) is the total horizontal distance within the user interface 100 that the particular (given) reference marker line 312-314 travels during the entire transition.

Figure 5B:
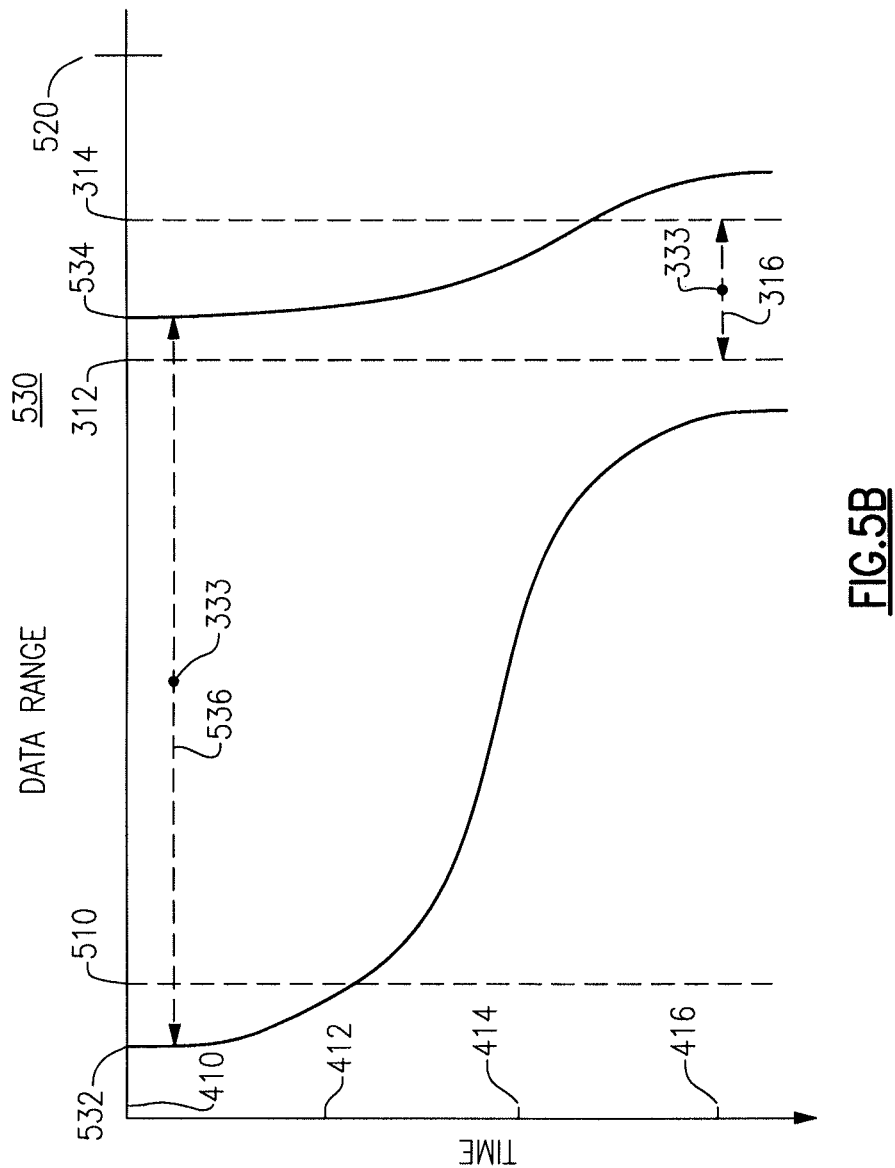
Figure 5C:
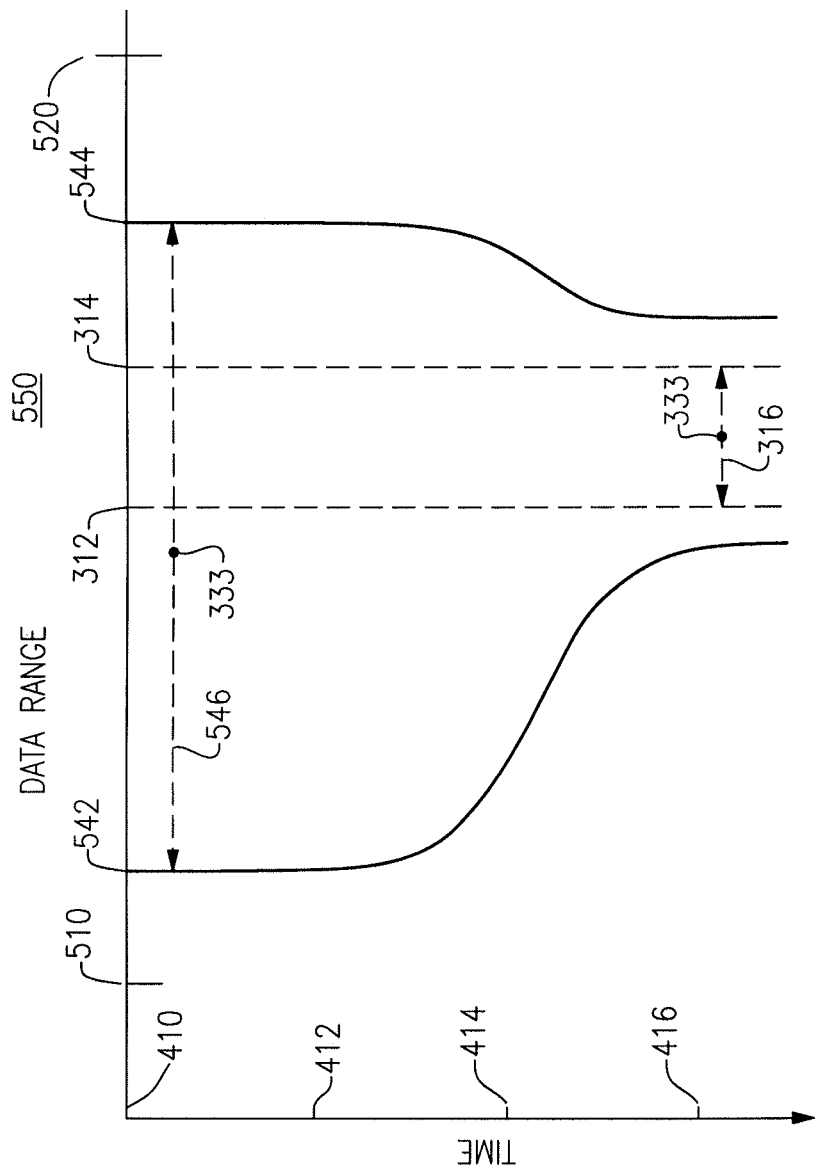

FIGS. 5A-5C illustrate a graphical representation of a transition between the rendering of the third image representation and a rendering of the fourth image representation, with respect to locations within a large range of data.

Referring to FIG. 5A, unlike FIGS. 4A-4B, a large range of data 500 over time is represented horizontally. The data range 500 starts at data collection time 510 and ends at data collection time 520. Specific data collection time values associated with the range of data 510-520 are not shown. A horizontal center location of the user interface screen, that is plotted relative to a location within the range of data displayed onto the user interface screen, is shown.

Like that described for FIGS. 4A-4B, the transition between different image representations of data is described here. Unlike that described for FIGS. 4A-4B, the transition is described with respect to the locations of portions of data within the range of data 510-520, that are displayed onto the user interface 100, and not with respect to specifics of how the marker locations are displayed in relation to user interface 100.

Like in FIGS. 4A-4B, viewing times are represented parallel to the vertical axis 104. Unlike in FIGS. 4A-4B, where the horizontal locations of markers 332 and 334 on the user interface 110 are plotted over time; here instead, a left hand boundary location of data 518a (associated with an earlier data collection time) and the right hand boundary location of data 518b (associated with a later data collection time), are shown as specific portions of data rendered onto the user interface 100 over time.

Instead, a left hand boundary location of data 518a (associated with an earlier data collection time) and the right hand boundary location of data 518b (associated with a later data collection time) are represented horizontally.

As shown, at a first viewing time 410, the user interface 100 displays a third image representation (not shown) including a portion of data 316 located within the reference markers 312-314. The third image representation is displayed onto the user interface 100 like the display of the first image representation 330 of FIG. 3B. At a second viewing time 416, a fourth image representation (not shown) including a portion of data 516 located within the reference markers 512-514 is displayed onto the user interface 100. The portion of data 516 is substantially larger than the portion of data 316. Furthermore, the portion of data 516 resides outside of the third image representation at time 410.

Each image representation, displays data in accordance with a magnification attribute value. A magnification attribute value is a measure of magnification (zoom) level relative to a reference standard. A magnification attribute value equal to (1.0) equals the reference standard. A magnification attribute value that is greater than (1.0) displays less data (at a higher zoom level) within the same user interface screen display area, than the reference standard. A magnification attribute that is lower than (1.0) displays more data (at a lower zoom level) within the same user interface screen display area, than the reference standard.

When the user interface 100 transitions from the third image representation to the fourth image representation, the user interface 100 displays more data 516 in the fourth image representation than data 316 of the third representation, within the same amount of user interface screen display area.

Hence, the magnification attribute value associated with the fourth image representation of the portion of data 516 is lower (less magnified) than that of the third image representation of the portion of data 316.

The transitions shown in FIGS. 4A-4B and FIGS. 5A-5C are illustrated using substantially the entire display area. In other embodiments, representations of data, such as the first, second, third, fourth, fifth and sixth image representation can be instead, each be represented within smaller portions of the display screen. These smaller portion embodiments can allow for side by side, or above/below display and comparison of separate and non-adjacent portions of data. Such side/side or top/bottom embodiments can be implemented by dividing the user interface screen into a left and right portion, or into a top and bottom portion.

In summary, transitioning between image representations of portions of data may or may not cause relative magnification to take place. Transition to display of a reference marker pair may not be of a reference marker pair that is visible on the user interface 100 at the start of the transition.

Referring to FIG. 5B, at a first viewing time 410, the user interface 100 displays a fifth image representation (not shown) including a portion of data 536 located within the reference markers 532-534. Notice that the fifth image representation spans to the left hand side to a location that is outside of the earliest available data 510 and includes only one reference marker 312 on its right hand side. Hence, the fifth image representation lacks some data at the left hand side as displayed by the user interface 100.

At a second viewing time 416, a third image representation (not shown) including a portion of data 316 located within the reference markers 312-314 is displayed onto the user interface 100. The third image representation is displayed onto the user interface 100 like the display of the first image representation 330 of FIG. 3B. The portion of data 536 is substantially larger than the portion of data 316. Furthermore, the portion of data 316 resides partially outside of the fifth image representation at time 410. As a result, only the reference marker 312 is visible within the fifth image representation.

When the user interface 100 transitions from the fifth image representation to the third image representation, the user interface 100 displays less data 316 in the third image representation than the amount of data 536 within the fifth image representation, and displays the data within the same amount of user interface screen display area. Hence, the magnification attribute value associated with the fifth image representation of the portion of data 516 is lower (less magnified) than that of the third image representation of the portion of data 316.

As a result, the transition between the fifth image representation and the third image representation causes an increase to the magnification attribute value of the third image representation as compared to the fifth image representation. Furthermore, the transition causes both reference markers 312-314 to come into view within the third representation.

Referring to FIG. 5C, at a first viewing time 410, the user interface 100 displays a sixth image representation (not shown) including a portion of data 546 located within the reference markers 542-544. Notice that the sixth image representation spans and includes both reference markers 312 and 314, like the first image representation of FIG. 3A.

At a second viewing time 416, a third image representation (not shown here) including a portion of data 316 located within the reference markers 312-314 is displayed onto the user interface 100. The third image representation is displayed onto the user interface 100 like the display of the first image representation 330 of FIG. 3B. The portion of data 546 is substantially larger than the portion of data 316.

When the user interface 100 transitions from the sixth image representation to the third image representation, the user interface 100 displays less data 316 in the third image representation than the amount of data 546 within the sixth image representation, and displays the data within the same amount of user interface screen display area. Hence, the magnification attribute value associated with the sixth image representation of the portion of data 546 is lower (less magnified) than that of the third image representation of the portion of data 316.

As a result, the transition between the sixth image representation and the third image representation causes an increase to the magnification attribute value of the third image representation as compared to the fifth image representation. Furthermore, the transition causes both reference markers 312-314 to come into view within the third representation.

A transition from the third representation to the sixth image representation, would cause a lowering of the magnification attribute value of the image displayed by the user interface 100.

In summary, the invention in one embodiment provides for an apparatus for magnification of information represented on an electronic display, the apparatus including: a display screen, a display area that resides within a least a portion of the display screen, a screen pointer that is displayable and position able within the display area in response to a physical location of a screen pointing device over time, a magnification window having a center location and that is configured to occlude and superimpose above a magnify to portion of the display area; the magnification window magnifying information displayed within a magnify from portion of the display area having a center location; and where the magnify from portion of the display area having a first dimension, and having a second dimension that is substantially perpendicular to the first dimension, and wherein the magnify from portion of the display area is magnified within the magnification window with respect to the first dimension only; and where the location of magnification window is a function of the location of the screen pointing device over time.

In some embodiments, the first dimension is a horizontal dimension and wherein the second dimension is a vertical dimension and wherein each of the first dimension and second dimension of the magnification window is separately assigned a magnification attribute value.

In some embodiments, the horizontal dimension of the magnification window is assigned a magnification attribute value that is greater than one and wherein the vertical dimension of the magnification window is assigned a magnification attribute value that is equal to one.

In some embodiments, said vertical dimension of said magnification window is assigned a magnification attribute value that is greater than one and wherein said horizontal dimension of said magnification window is assigned a magnification attribute value that is equal to one.

In some embodiments, said center location of said magnify from portion is substantially proximate to the center location of the magnify to portion of the display area and wherein the horizontal and vertical dimension of the magnify from portion are each respectively sized as a function of the magnification attribute assigned to the horizontal dimension of the magnify to portion and of the vertical dimension of the magnify to portion.

In some embodiments, the vertical dimension of the magnify to portion of the display and of the magnify from portion of the display are substantially equal in size to each other and where the horizontal dimension of the magnify from portion is substantially less than the horizontal dimension of the magnify to portion.

In some embodiments, the display area includes information representing at least one characteristic of one or more signals over a period of time; and wherein the period of time is represented parallel to a first dimensional axis.

Optionally, the apparatus of claim 2 wherein the first dimension magnification attribute value is adjustable via a thumb wheel of the screen pointing device or other user interface menu. Or, the first dimension magnification attribute value and second magnification attribute value are each adjustable via a user interface mechanism accessible via other than the screen pointing device.

In another aspect of the invention, the invention provides for an apparatus for magnification of information represented on an electronic display, the apparatus including: a display screen, a display area that resides within at least a portion of the display screen and that includes a first portion that is configured to render a first image representing at least a first portion of a data range, the data range including a first reference marker and a second reference marker, a second image having a center location and that is constructed in response to a user communicated command and that is configured to overlay a second portion of the display area; the second image representing a second portion of the data range that includes the first reference marker and the second reference marker; and where the second image having a first dimension that is parallel to a direction that is defined by locations of a rendering of the first reference marker and the second reference marker within the second image, and having a second dimension that is substantially perpendicular to the first dimension, and wherein the second image represents the second portion of the data range in accordance with a magnification attribute value associated with the first dimension only, that is substantially not equal to that of the first image.

In some embodiments, a first dimensional size of the second portion of the data range as it is rendered within the second image is substantially non-equal to a first dimensional size of the second portion of the data range as rendered within the display area.

In some embodiments, a second dimensional size of the second portion of the data range as rendered within the second image is substantially equal to a second dimensional size of the second portion of the data range as rendered within the display area.

In some embodiments, the center location of the second image represents a rendering of a center portion of the data range that is located midway between the first reference marker and the second reference marker, and wherein the center location of the second image is substantially shifted with respect to a first dimensional axis, as compared to a location where the center portion of the data range is rendered within the first portion of the display area.

In some embodiments and user scenarios, the center location of the second image is substantially not shifted with respect to a second dimensional axis, as compared to a location where the center portion of said data range is rendered within said display area.

In some embodiments, rendering of data from said second portion of said data range initially occurs at a start of a period of time and finally occurs within the second image representation at an end of the period of time, and wherein the rendering occurs at a non-linear rate over the period of time. Optionally, the non-linear rate over time is dependent upon a trigonometric function. In some embodiments, the trigonometric function is s cosine function.

In some embodiments, the data range includes information representing at least one characteristic of at least one signal over a period of time; and wherein the period of time is represented within the display area in a direction parallel to a first dimensional axis.

In some embodiments, the first portion of the display area and the second image each include a representation of the first reference marker and the second reference marker. Optionally, the second image further includes a margin that is located outside of the first reference marker and the second reference marker with respect to a first dimensional axis.

In some embodiments, a button that is associated with the first reference marker and the second reference marker is activated to execute the user command. In some embodiments, area occupied by the first portion of the display area is equal to that of the second portion of the display area.

In some embodiments, at least one of the first portion of the display area and the second portion of the display area occupy an area substantially equal to a size of the display area.

PARTS LIST

100 user interface
102 horizontal axis
104 vertical axis
106 screen pointer
110 signal monitoring area
112 digital signal
114 digital signal
116 digital signal
118 analog signal
120 range of data collection time
122 screen label
124 screen label
126 screen label
128 screen label
134 push buttons
212 digital signal
214 digital signal
216 digital signal
220 range of data collection time
240 magnification window grid
242 magnify from area
244 magnify to area
246 margin of magnification window grid
260 magnification window
310 range of data
312 reference marker
314 reference marker
316 first portion of data range
318 push button associated with reference marker pair
322 horizontal screen location
324 horizontal screen location
332 horizontal screen location
334 horizontal screen location
410 viewing point in time\
412 viewing point in time
414 viewing point in time
416 viewing point in time
422 viewing point in time
424 viewing point in time
426 viewing point in time
510 data collection point in time
512 data collection point in time
514 data collection point in time
516 portion of data
518 data location 520 data collection point in time
532 reference marker
534 reference marker
536 portion of data
542 reference marker
544 reference marker
546 portion of data It will be readily apparent that other modifications and variations are possible within the intended ambits of the present invention, according to the following claims.

The invention claimed is:

1. An apparatus for magnification of information represented on an electronic display, the apparatus including:
    a display screen;
    a display area that resides within a least a portion of said display screen;
    a screen pointer that is displayable and capable of being positioned within said display area in response to a physical location of a screen pointing device over time;
    a magnification window grid including a magnification window having a center location and that is configured to not occlude and to not magnify display area data that is located within a magnify-to portion of said magnification window, prior to invocation of a command; and that is further configured to magnify and display said display area data located from within a magnify-from portion of said magnification window, into said magnify-to portion of said magnification window, upon invocation of said command; and
    wherein said magnify-to and said magnify-from portions of said magnification window grid are visibly delimited prior to invocation of said command.

2. The apparatus of claim 1 wherein a first dimension is a horizontal dimension and wherein a second dimension is a vertical dimension and wherein each of said first dimension and second dimension of said magnification window is separately assigned a magnification attribute value.

3. The apparatus of claim 2 wherein said horizontal dimension of said magnification window is assigned a magnification attribute value that is greater than one and wherein said vertical dimension of said magnification window is assigned a magnification attribute value that is equal to one.

4. The apparatus of claim 2 wherein said vertical dimension of said magnification window is assigned a magnification attribute value that is greater than one and wherein said horizontal dimension of said magnification window is assigned a magnification attribute value that is equal to one.

5. The apparatus of claim 2 wherein said center location of said magnify-from portion is proximate to said center location of said magnify to portion of said display area and wherein said horizontal and vertical dimension of said magnify-from portion are each respectively sized as a function of said magnification attribute assigned to said horizontal dimension of said magnify-to portion and of said vertical dimension of said magnify-to portion.

6. The apparatus of claim 5 wherein said vertical dimension of said magnify-to portion of said display and of said magnify-from portion of said display are substantially equal in size to each other and where said horizontal dimension of said magnify-from portion is less than said horizontal dimension of said magnify-to portion.

7. The apparatus of claim 2 wherein said display area includes information representing at least one characteristic of one or more signals over a period of time; and wherein said period of time is represented parallel to a first dimensional axis.

8. The apparatus of claim 2 wherein said first dimension magnification attribute value is adjustable via a thumb wheel of said screen pointing device.

9. The apparatus of claim 2 wherein said first dimension magnification attribute value and second magnification attribute value are each adjustable via a user interface mechanism accessible via other than said screen pointing device.

10. A method for magnification of information represented on an electronic display, including the steps of:
    providing a display screen;
    providing a display area that resides within a least a portion of said display screen;
    providing a screen pointer that is displayable and capable of being positioned within said display area in response to a physical location of a screen pointing device over time;
    providing a magnification window grid including a magnification window having a center location and that is configured to not occlude and to not magnify display area data that is located within a magnify-to portion of said magnification window, prior to invocation of a command; and that is further configured to magnify and display said display area data located from within a magnify-from portion of said magnification window, into said magnify-to portion of said magnification window, upon invocation of said command; and
    wherein said magnify-to and said magnify-from portions of said magnification window grid are visibly delimited prior to invocation of said command.

11. The method of claim 10 wherein a first dimension is a horizontal dimension and wherein a second dimension is a vertical dimension and wherein each of said first dimension and second dimension of said magnification window is separately assigned a magnification attribute value.

12. The method of claim 11 wherein said horizontal dimension of said magnification window is assigned a magnification attribute value that is greater than one and wherein said vertical dimension of said magnification window is assigned a magnification attribute value that is equal to one.

13. The method of claim 11 wherein said vertical dimension of said magnification window is assigned a magnification attribute value that is greater than one and wherein said horizontal dimension of said magnification window is assigned a magnification attribute value that is equal to one.

14. The method of claim 11 wherein said center location of said magnify-from portion is proximate to said center location of said magnify to portion of said display area and wherein said horizontal and vertical dimension of said magnify-from portion are each respectively sized as a function of said magnification attribute assigned to said horizontal dimension of said magnify-to portion and of said vertical dimension of said magnify-to portion.

15. The method of claim 14 wherein said vertical dimension of said magnify-to portion of said display and of said magnify-from portion of said display are substantially equal in size to each other and where said horizontal dimension of said magnify-from portion is less than said horizontal dimension of said magnify-to portion.

16. The method of claim 11 wherein said display area includes information representing at least one characteristic of one or more signals over a period of time; and wherein said period of time is represented parallel to a first dimensional axis.

17. The method of claim 11 wherein said first dimension magnification attribute value is adjustable via a thumb wheel of said screen pointing device.

18. The method of claim 11 wherein said first dimension magnification attribute value and second magnification attribute value are each adjustable via a user interface mechanism accessible via other than said screen pointing device.

* * * * *